United States Patent [19]

Henri

[11] Patent Number: 4,784,702

[45] Date of Patent: Nov. 15, 1988

[54] PIN PHOTODIODE FORMED FROM AN AMORPHOUS SEMICONDUCTOR

[75] Inventor: Yves Henri, Eybens, France

[73] Assignee: Thomson-CSF, Paris, France

[21] Appl. No.: 39,538

[22] Filed: Apr. 16, 1987

[30] Foreign Application Priority Data

Apr. 22, 1986 [FR] France ............................ 86 05806

[51] Int. Cl.$^4$ ............................................. H01L 31/06
[52] U.S. Cl. ...................................... 136/258; 357/4;
357/30; 357/88
[58] Field of Search ................. 357/4 SL, 30 J, 30 K,
357/88; 136/258 AM

[56] References Cited

U.S. PATENT DOCUMENTS

| 4,278,474 | 7/1981 | Blakeslee et al. | 136/249 TJ |
|---|---|---|---|
| 4,598,164 | 7/1986 | Tiedje et al. | 136/249 TJ |
| 4,642,144 | 2/1987 | Tiedje et al. | 437/101 |
| 4,705,912 | 11/1987 | Nakashima et al. | 136/258 |
| 4,718,947 | 1/1988 | Arya | 136/258 |
| 4,719,123 | 1/1988 | Haku et al. | 437/101 |
| 4,721,535 | 1/1988 | Itoh et al. | 136/258 |

FOREIGN PATENT DOCUMENTS 0133342 2/1985 European Pat. Off. .
59-163878 9/1984 Japan .
61-222215 10/1986 Japan ................... 136/258 AM
2107927 5/1983 United Kingdom .

OTHER PUBLICATIONS

S. Tsuda et al., *Jap. J. Appl. Phys.*, vol. 26, pp. 28–32 (Jan. 1987).
D. A. B. Miller et al., *Appl. Phys. Lett.*, vol. 45, pp. 13–15 (1984).
F. Capasso et al., *Appl. Phys. Lett.*, vol. 45, pp. 1193–1195 (1984).
F. Capasso, *Laser Focus*, Jul. 1984, pp. 84, 86, 88, 90, 92, 94, 96, 98, 100, 101.
F. Capasso et al., *Appl. Phys. Lett.*, vol. 40, pp. 38–40 (1982).
T. H. Wood et al., *Appl. Phys. Lett.*, vol. 44, pp. 16–18 (1984).

*Primary Examiner*—Aaron Weisstuch
*Attorney, Agent, or Firm*—Roland Plottel

[57] ABSTRACT

The invention provides a PIN photodiode in which at least one of the P, I, N layers is formed by a composition multi-layer including undoped superimposed layers of amorphous semiconductor and undoped insulator. In one embodiment, the P and N layers are formed by an amorphous multi-layer, with five periods for the P layer and nine periods for the N layer, and the I layer is formed from an amorphous semiconductor.

15 Claims, 4 Drawing Sheets

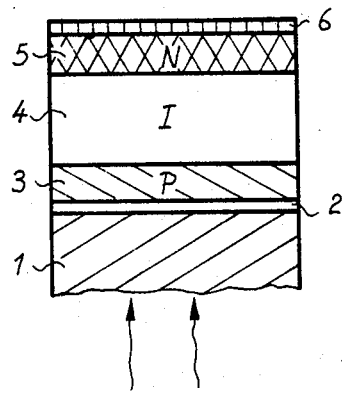
FIG_1
PRIOR ART
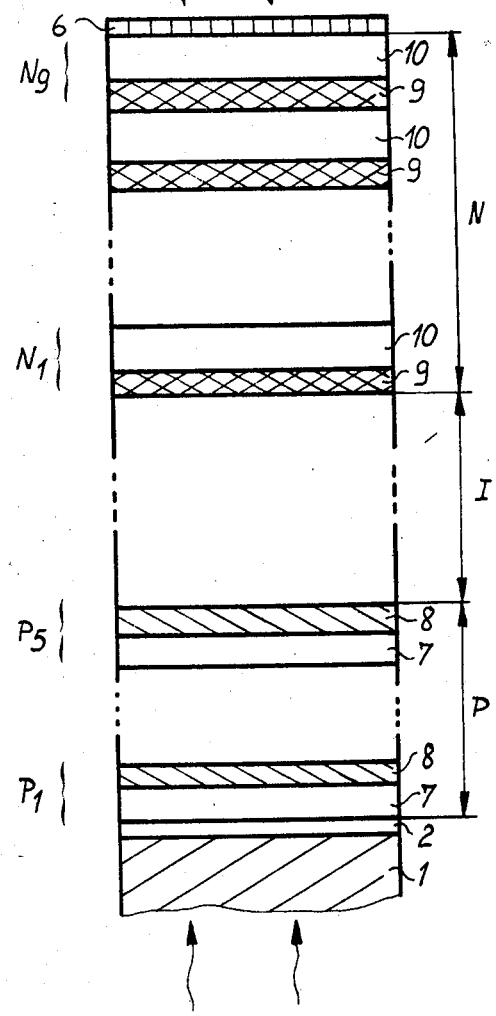
FIG_2

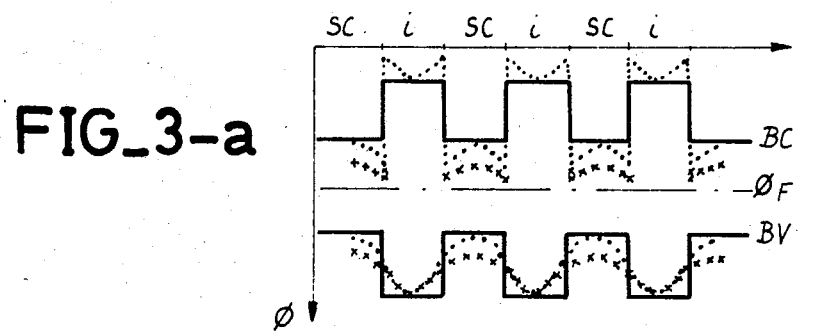
FIG_3-a
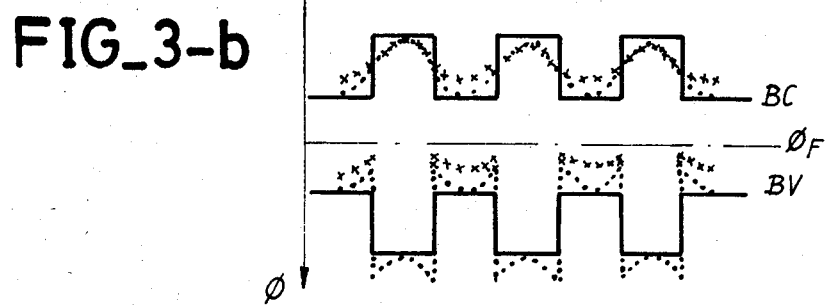
FIG_3-b
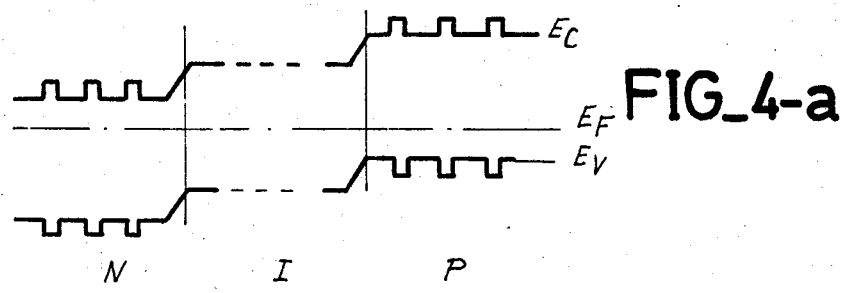
FIG_4-a
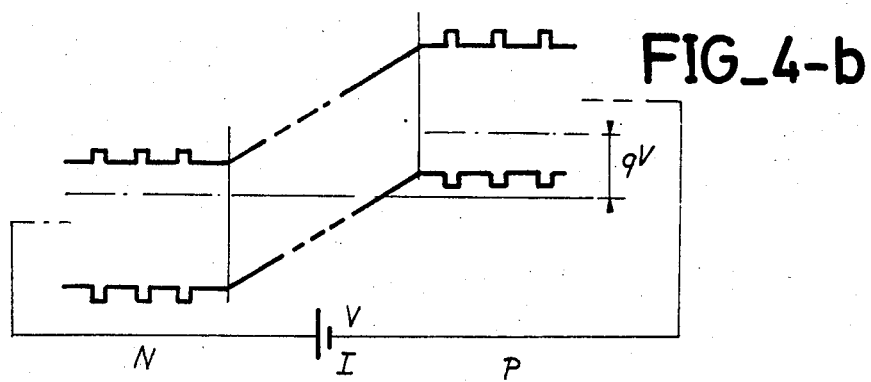
FIG_4-b

FIG_5
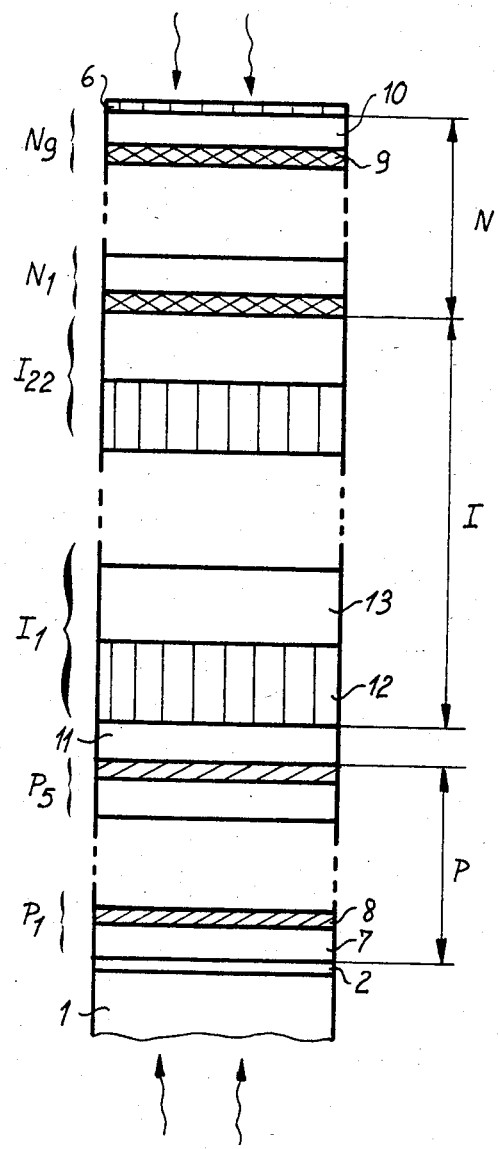

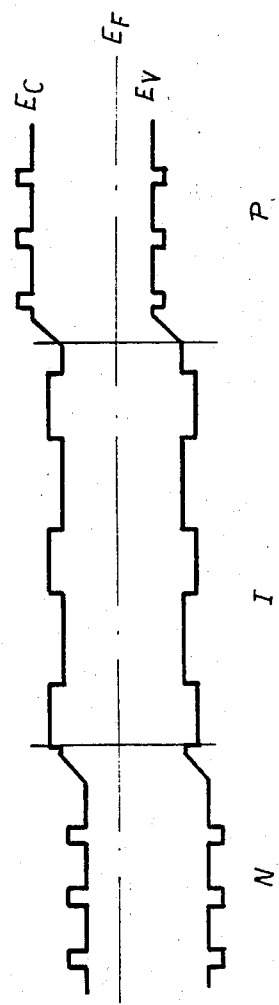
FIG_6-a
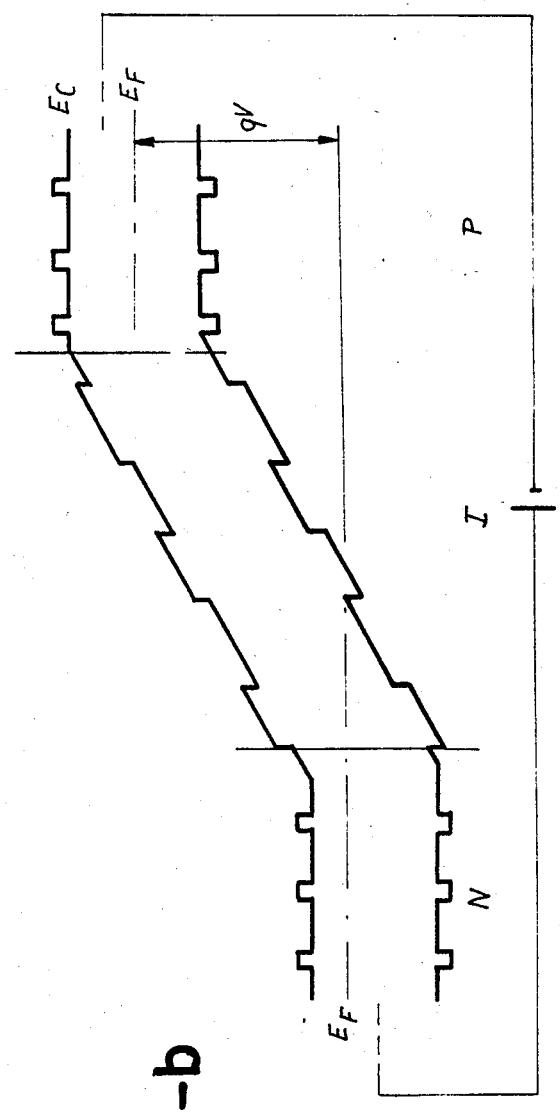
FIG_6-b

PIN PHOTODIODE FORMED FROM AN AMORPHOUS SEMICONDUCTOR

BACKGROUND OF THE INVENTION

1. Field of the Invention

The present invention relates to a PIN photodiode formed from an amorphous semiconductor.

2. Description of the Prior Art

It is known to form PIN photodiodes from amorphous silicon.

Amorphous silicon is used, in preference to crystalline silicon, for different reasons. One of these reasons is that amorphous silicon has characteristics different from those of crystalline silicon and which, in certain uses, are more interesting.

Thus, the forbidden band width of crystalline silicon is from 1.1 e-V to 1.15 e-V, whereas that of amorphous silicon is from 1.6 to 1.75 e-V. Crystalline silicon provides detection in the visible range over a very great thickness with respect to that of amorphous silicon (a few tens of micrometers vs. 0.5 micrometer). Another reason for using amorphous silicon in preference to crystalline silicon is that it is possible to deposit large areas of amorphous silicon rapidly on a cheap material such as glass. On the contrary, crystalline silicon can only be deposited over small areas and that requires much higher temperatures.

Because of its disordered nature, in the crystallographic meaning of the term, amorphous silicon contains a large number of defects. These defects introduce so called localized states inside the forbidden band. Hydrogenated amorphous silicon is generally used which is a variant containing hydrogen which, by fixing itself on pendant links, that is to say unsatisfied, of silicon atoms reduces the density of the defects and improves the quality of the amorphous silicon.

Amorphous silicon is used more particularly in solar cells fitted for example to calculators and to detector strips, intended for telecopying.

The amorphous silicon PIN photodiodes which are known have numerous drawbacks. Among these drawbacks may be mentioned the fact that the P and N layers are obtained by doping, which considerably increases the number of defects of the amorphous silicon, since the number of defects is multiplied by a factor of the order of 100.

Another drawback is that, in order to obtain P or N type amorphous silicon, it is necessary to add to the silane, the thermal decomposition of which gives rise to amorphous silicon, a high concentration of the order of 5 to 10,000 ppm of a doping gas, such as diborane for obtaining the P type and phosphine for obtaining the N type. Now, diborane and phosphine are extremely dangerous gases in high concentration. The maximum dose tolerable for the human organism is 0.1 ppm for diborane and 0.3 ppm for phosphine, which involves very expensive safety measures for preventing leaks and treating the effluents from the depositing machines.

Another drawback of known amorphous silicon PIN photodiodes is that it is not possible to impinge the radiation to be detected indifferently on the N side or on the P side of the photodiode. In FIG. 1 an embodiment has been shown in which the radiation impinges on the P side. If it is desired to illuminate the N side, that is possible but requires modifying the structure of the photodiode so as to reduce the thickness of the N type layer so as to make it less absorbent. An additional drawback of heavy doping is that it makes the materials more absorbent.

Another drawback of the known amorphous silicon PIN photodiodes is that they have a high capacitance which may limit their use in photosensitive matrix structures, formed of interconnected photosensitive elements, in which each photosensitive element includes a PIN photodiode. These photosensitive structures may be used for detecting any type of rays, for example X rays when the photosensitive structure is preceded by a scintillator.

The present invention relates to PIN photodiodes formed from an amorphous silicon which, depending on the embodiments, overcome some or all the above mentioned drawbacks. They use the quantum effects of crystalline semiconductor multi-layers in the particular form they assume when the material is an amorphous semiconductor.

These multi-layers are described theoretically in the article by Inan Chen, published in "Physical review B", vol. 32, no. 2, July 15, 1985, page 885.

There exist two large categories of multi-layers. The first is that of the composition multi-layers in which there is superimposition of layers of different physico-chemical natures, doped or not. The second is that of doping multi-layers in which there is superimposition of layers of the same physico-chemical nature, but doped alternately P and N.

SUMMARY OF THE INVENTION

The present invention relates to a PIN photodiode, formed from an amorphous semiconductor, having three superimposed zones which are a P zone, an intrinsic zone and an N zone, wherein at least one of these zones is formed by a composition multi-layer, having superimposed amorphous semiconductor and insulating zones, not doped, and the other zone or layers are formed from an amorphous semiconductor.

In the invention, composition multi-layers are used formed by the superimposition of layers of different physico-chemical nature and not doped so as to form at least one of the P, N or intrinsic type zones of the PIN photodiodes.

The PIN photodiodes of the invention, in the case where their P and N zones are formed by multi-layers, no longer require use of doping gases during manufacture thereof. Consequently, the installations required for their manufacture are simplified. In addition, the P or N type zones obtained are of better quality since there is no doping, the cause of numerous defects.

The P and N zones formed by multi-layers are more transparent that those obtained by doping. The PIN photodiodes of the invention may then be illuminated indifferently from their P side or their N side or from both sides simultaneously.

The use of a multi-layer for forming the intrinsic zone reduces the capacitance of the PIN photodiodes which may then be used in matrix devices. It should be noted that it is also possible, if desired, to increase the capacitance of the PIN photodiodes because a multi-layer is used for forming the intrinsic zone.

BRIEF DESCRIPTION OF THE DRAWINGS

Other objects, features and results of the invention will be clear from the following description, given by way of non limitative example and illustrated by the accompanying Figures, wherein:

FIG. 1 is a sectional view of an amorphous silicon PIN photodiode of the prior art;

FIGS. 2 and 5 are sectional views of two multi-layer PIN photodiodes of the invention; and FIGS. 3a and 3b, 4a and 4b, and 6a and 6b, are diagrams explaining the operation of the photodiodes of FIGS. 2 and 5.

DESCRIPTION OF THE PREFERRED EMBODIMENT

In the different Figures, the same references designate the same elements but, for the sake of clarity, the sizes and proportions of the different elements have not been respected.

FIG. 1 shows in sectional view one embodiment of a photodiode of the prior art.

This photodiode is formed by the superimposition of the following layers:

a glass substrate 1 which receives the light to be analysed, shown symbolically by the wavy arrows;

a transparent conducting layer 2 whose thickness may vary between 50 and 200 nm;

a P type zone 3 made from hydrogenated amorphous silicon or hydrogenated amorphous silicon carbide which provides a better transfer of the blue photons than silicon. The thickness of zone 3 may vary between 10 and 30 nm. The P type conductivity is generally obtained by doping with boron;

an intrinsic zone I which bears the reference 4, made from undoped hydrogenated amorphous silicon, which is the zone through which the electric field extends for separating the charge carriers created by absorption of the light flux to be analysed. The thickness of the intrinsic zone 4 varies between 500 and 1000 nanometers;

a hydrogenated N type amorphous silicon zone 5. The thickness of this layer varies from 30 to 50 nm. The N type conductivity is generally obtained by doping with phosphorous;

a conducting layer 6, generally made from metal.

FIG. 2 shows a sectional view of one embodiment of a PIN photodiode of the invention.

This embodiment differs from that of FIG. 1 in that the P and N zones are formed by composition multi-layers formed by the superimposition of undoped amorphous semiconductor and insulating layers behaving respectively like a P type material and an N type material.

The intrinsic zone I is, as in the case of FIG. 1 relative to the prior art, formed of a solid amorphous semiconductor.

The P type zone is formed by the superimposition of layers 7, made from hydrogenated amorphous silicon, which is written a—Si:H, whose thickness is about 4 nm and layers 8, made from a positively charged hydrogenated amorphous insulator, for example of formula a—Si $O_x$:H, with $x \leq 2$, for the material is never totally stoichiometric, the thickness of layers 8 is about 2 nm. The thickness of the superimposition of two layers 7 and 8 is called a period. The multi-layer forming the P type zone has five periods, referenced $P_1$ to $P_5$. The insulator used may be amorphous or crystalline and in this case $x=2$. In the preferred method of manufacturing the multi-layers, the insulator obtained is amorphous. The method of manufacture is glow discharge.

After the P type zone, we find the intrinsic zone designated by the reference I. It is formed from about 500 nm of hydrogenated amorphous silicon a—Si:H.

After the intrinsic zone, there is the N type zone formed by a multi-layer of 9 periods, bearing the references $N_1$ to $N_9$. Each period is formed by a negatively charged insulating layer 9, for example of formula a—$Si_yN_x$:H, with $x = \leq 4$ and $y \leq 3$, about 2 nm thick, and a hydrogenated amorphous silicon layer 10 a—Si:H.

The thickness of the zone formed by the multi-layers, as well as the number of their periods, is chosen depending on the conductivity desired for the P, N or I zones to be formed and depending on the transparency desired for the photodiodes. Three superimposed layers are required at the minimum, one insulating, one semiconductor and one insulating so as to obtain a composition multi-layer.

The thickness of the insulating layers must be sufficiently small for the charge carriers generated in the space charged zone of the intrinsic silicon to be able to cross over, by tunnel effect, the potential barriers formed by the insulator.

Insofar as the nature of the undoped insulating layers is concerned, it is clear that the examples given in the description of FIG. 2 are not limiting. In addition to the insulating materials a—$SiO_x$:H and a—$Si_yN_x$:H, insulating materials may be used, amorphous or not, hydrogenated or not, of formula $Al_x$, $O_y$, with $x \leq 2$ and $y \leq 3$, (negatively charged insulator), AlN, AlON, SiON, $SiC_x$, with $x > 0.5$ (positively charged insulating material).

Similarly, insofar as the amorphous semiconductor used for forming the multi-layers is concerned, it is not limited to silicon, and amorphous semiconductors such as materials of type III-V (e.g., gallium arsenide), germanium, chalcogenides, for example, those having several elements in column 2 of the periodic table, may also be used.

FIGS. 3a and 3b and 4a and 4b illustrate the operation of the multi-layers used in the embodiment of FIG. 2.

In FIGS. 3a and 3b, the potentials $\phi$ have been shown as ordinates and, in particular, the position of the conduction band BC, of the valency band BV and the position of the Fermi level $\phi_F$ have been shown.

In these Figures, the succession of insulating layers i and semiconductor layers SC have been plotted as abscissa.

The potentials shown with a continuous line correspond to the position of the conduction band and of the valence band in the semiconductor and in the insulator if modifications made to the potentials by the presence of the insulators is not taken into account.

The dotted lines show how these potentials are modified because of the presence of the insulators.

If we consider insulating layers whose thickness does not vary, the potentials are represented by a succession of dots in the case of very thick amorphous semiconductor layers and by a succession of crosses in the case of thin amorphous semiconductor layers.

FIG. 3a corresponds to the case of a negatively charged insulator, such as amorphous hydrogenated $Si_yN_x$, which allows a multi-layer to be obtained whose characteristic is equal to that of a single N type layer.

FIG. 3b corresponds to the case of a positively charged insulator, such as amorphous hydrogenated $SiO_x$, which allows a multi-layer to be obtained whose operation is equivalent to that of a P type layer.

The amorphous multi-layers, which behave like a P type or N type layer, consist then of an alternation of insulating layers i with large forbidden band width and amorphous semiconducting layers SC with smaller forbidden band width, as can be seen in FIGS. 3a and 3b.

As in the case of crystalline multi-layers, there are discontinuities in the forbidden band resulting in barriers and potential wells.

In the case of the described layer alternations, in which each period includes an insulating layer and an amorphous SC layer, the presence of the insulators modifies the connections of the bands. The insulators are known as being charge carriers with surface densities generally between $10^{11}$ and $10^{12}$ charges/cm². These charges may be positive or negative depending on the nature of the insulator. They are injected into the adjacent semiconductor.

In the case where the insulator is negatively charged, as in FIG. 3a, the potential drops on the insulator side and increases on the semiconductor side. At the level of the conduction band, that makes the potential well deeper, the smaller the thickness of the semiconductor and the resistivity therefore decreases. At the level of the valence band, the potential well becomes shallower.

For a thickness of the semiconductor layers less than 10 nm, the potential in these layers is almost constant over their whole thickness.

In the case of a positively charged insulator, as in FIG. 3b, it can be seen that the potential modifications which, in the case of FIG. 3a, reach the conduction band, in this case reach the valence band, and vice versa.

The position of the Fermi level $\phi_F$ is fixed by the insulator. For thicknesses less than 10 nm, the Fermi level $\phi_F$ is situated at about 0.175 eV from the edge of the conduction band in the case of a multi-layer using a negatively charged insulator and at 0.22 eV from the edge of the valence band in the case of a multi-layer using a positively charged insulator.

Thus, depending on the insulator used, a multi-layer is obtained behaving as a P type layer or as an N type layer, without any doping being used. This is said to be space charged doping. The avoidance of doped materials reduces enormously the number of defects.

It should be noted that by modifying the thickness of the semiconductor layers and by maintaining the thickness of the insulating layers constant, the multi-layers behave as P type or N type materials whose doping are modified.

FIGS. 4a and 4b are band diagrams corresponding to the photodiode of FIG. 2.

FIG. 4a relates to the case of a photodiode which receives no bias and FIG. 4b the case of a photodiode which is reversely biased.

From left to right, the state of the N, I and P zones have been shown as abscissa. The conduction band $E_c$, the Fermi level $E_F$ and the valence band $E_v$ are shown as ordinates.

For the intrinsic undoped amorphous silicon zone, the Fermi level $E_F$ is substantially at 0.72 eV from the edge of the conduction band.

In FIG. 4b, the position of the Fermi levels obtained when the photodiode is reversely biased shows that a rectifying effect is obtained. It can be seen that the shift of the Fermi levels between the P zone and the N zone is equal to q.V, with q the charge of the electron and V the reverse bias voltage.

Another advantage of the multilayers, for small thicknesses of the semiconductor layers, is the increase of the resultant forbidden band with respect to that of hydrogenated amorphous silicon. The optical absorption coefficient, for equal wavelengths, is smaller in the case of a multi-layer than for solid amorphous silicon. Consequently, the transparency is better for the PIN diodes of the invention which use multi-layers than for the PIN diodes of the prior art, which allows the spectral response to extend towards the blue.

It is then possible to illuminate the diodes of the invention from either of their sides without modifying the structure or from both sides, as is shown in FIG. 2. It is no longer necessary as in the prior art to use amorphous silicon carbide in the place of amorphous silicon for improving the transmission of the blue-green photons and for absorbing them in an intrinsic silicon layer.

FIG. 5 shows in a sectional view one embodiment of a PIN photodiode of the invention which differs from the embodiment of FIG. 2, in that the intrinsic zone I is also formed by a multi-layer of the same type as the multi-layers forming the P type and N type zones.

The intrinsic zone I is therefore formed by a composition multi-layer, with undoped superimposed layers of amorphous semiconductor and amorphous or non-amorphous insulator.

In the embodiment shown in FIG. 5, the multi-zone forming the intrinsic layer comprises 22 periods $I_1$ to $I_{22}$. Each period is formed of an amorphous insulating layer 12, for example of formula a—$Si_yN_x$:H, of a thickness of about 10 nm and an amorphous semiconductor layer 13 made for example from hydrogenated amorphous silicon, of about 80 nm in thickness.

A hydrogenated amorphous silicon layer 11 provides the transition between the P and I zones. Its thickness may vary between 1 and 10 nm. Between the I and N zones, there are no transition layers for it is assumed that the P and N zones are of the same nature as in the example shown in FIG. 2, and in this case the insulator N of the N zone is of the same nature as the insulator 12 of the I zone.

The advantage of the structure shown in FIG. 5 is that it allows the capacitance of the photodiodes to be modified with respect to the prior art.

By $L_S$ is designated the thickness of the semiconductor layers, by $L_I$ the thickness of the insulating layers used in the multi-layer forming the intrinsic zone I. By $\epsilon_S$ and $\epsilon_I$ are designated the permittivities of the semiconductor and of the insulator.

One effect of the multi-layers is that they produce an anisotropy of the resultant permittivity, that is to say, the permittivity perpendicular to the plane of the layers, $\epsilon_\perp$, is different from the permittivity in the direction parallel to the plane of the layers, $\epsilon_\parallel$.

The expressions for these permittivities are the following:

$$\epsilon_\parallel = (L_S + L_I) \cdot \epsilon_S \cdot \epsilon_I (\epsilon_S L_I + \epsilon_I L_S)^{-1}$$

$$\epsilon_\perp = (L_I \epsilon_I + L_S \epsilon_S) \cdot (L_I + L_S)^{-1}$$

By way of example, for a thickness $L_S = 80$ nm and $L_I = 10$ nm, with $\epsilon_S \approx 10$ and $\epsilon_I \approx 3.9$, we have $\epsilon_\perp = 7$, with a substantially maintained resistivity of the order of $10^9$ Ω cm.

This modification of the permittivity $\epsilon_\perp$ allows the capacitance of the PIN photodiodes of the invention to be reduced.

In fact, the capacitance of a total depletion photodiode depends essentially on the characteristics of its intrinsic layer, and more precisely on the permittivity $\epsilon$ of its intrinsic layer.

In the photodiodes of the invention, it is possible that the P and N zones, when they are formed by multi-layers formed by undoped layers, play a part in the capacitance of the depletion photodiode. That results in a greater reduction of the capacitance.

In the case of a photodiode 100×100 micrometers square, whose intrinsic zone is made from solid amorphous silicon, of a thickness of 2 micrometers, the capacitance is 1.8 picofarad. If a photodiode of the same area is used, whose intrinsic zone has the same thickness but is formed by a multi-layer of 22 periods such as that described above, the capacitance is only 1.2 picofarad.

In the case of a matrix device including 1000 diodes in parallel, the capacitance of the whole is 1.2 nanofarad when multi-layers are used, whereas it is 1.8 nanofarad with the photodiodes of the prior art.

The invention thus allows the capacitance of th PIN photodiodes to be substantially reduced, which improves their use in matrix devices.

It is possible to further reduce the capacitance of the PIN photodiodes of the invention by forming the intrinsic zone by stacking several multi-layers of different permittivity $\epsilon_\perp$.

The use of a multi-layer for forming the intrinsic zone also allows the capacitance of the photodiodes to be increased, if desired. Insulating layers must then be used whose permittivity $\epsilon_I$ is high, for example of amorphous titanium oxide.

Like FIGS. 4a and 4b, FIGS. 6a and 6b are band diagrams relative to the photodiode of FIG. 5. FIG. 6a relates to the case where the photodiode receives no bias and FIG. 6b relates to the case where the photodiode is reversely biased.

Like FIG. 4b, FIG. 6b shows that a rectifying effect is obtained when the photodiode is reversely biased.

FIGS. 2 and 5 illustrate two embodiments of the invention in which the P and N zones and the P, I, N zones are formed respectively by multi-layers.

It will be readily understood that the invention relates to PIN diodes in which at least one of the P, I, N zones is formed by a multi-layer, comprising undoped superimposed layers of amorphous semiconductor and insulator. The zone or zones which are not formed by multi-layers are formed from solid amorphous semiconductor.

The invention then covers the embodiments in which only one of the zones P, I or N is a multi-layer, as well as the embodiments in which two zones P and I or N and I are multi-layers.

The PIN photodiodes of the invention may be used in solar cells fitted for example to calculators. The advantage of the invention is that these solar cells may be illuminated on their two faces, which increases their efficiency.

The photodiodes of the invention may be used in detector strips, intended for telescopying.

Finally, they may be used for X ray detection, whether for checking luggage or in the field of medical X ray photography.

In these uses, they are preceded by a scintillator which converts the X rays into visible rays. Scintillators are known which produce rays of a wave length of about 550 nm which the amorphous silicon is quite capable of detecting.

What is claimed is:

1. A PIN photodiode formed from an amorphous semiconductor, having an intrinsic semiconductor zone sandwiched between two outer zones, wherein at least one of said two outer zones is formed by a multilayer composition comprising undoped alternate layers of an amorphous semiconductor and an insulator, the other zones of the diode being formed with amorphous semiconductor.

2. A photodiode as claimed in claim 1, wherein said one outer zone is formed from a multilayer composition formed by the superimposition of undoped alternate layers of an amorphous semiconductor and a positively charged insulator.

3. A photodiode as claimed in claim 2, wherein the positively charged insulator has the following formula: $SiC_x$ with x larger than 0.5, or $SiO_x$ with x not larger than 2.

4. A photodiode as claimed in claim 1, wherein said one outer zone is formed by a multilayer composition obtained by the superimposition of undoped alternate layers of an amorphous semiconductor and a negatively charged insulator.

5. The photodiode as claimed in claim 4, wherein said negatively charged insulator has the following formula: $SiY_Nx$, with y and x not larger than 3 and 4, respectively, or $Al_xO_y$ with x and y not larger than 2 and 3, respectively.

6. The photodiode as claimed in claim 1, wherein said undoped amorphous semiconductor is hydrogenated amorphous silicon.

7. The photodiode as claimed in claim 1, wherein the insulator is a hydrogenated amorphous insulator.

8. A PIN photodiode comprising P-type and N-type outer zones bounding an intrinsic inner zone, characterized in that at least one of the two outer zones comprises a multilayer including a plurality of successive periods, each period including a layer of an undoped amorphous semiconductor contiguous to a layer of an undoped amorphous insulator, and any remaining zones being of an amorphous semiconductor.

9. A PIN photodiode in accordance with claim 8 in which each of the layers of amorphous insulator is sufficiently thin that charges carriers generated in the intrinsic inner zone can tunnel therethrough.

10. A PIN photodiode in accordance with claim 9 in which the undoped semiconductor is hydrogenated silicon and the undoped amorphous insulator is hydrogenated silicon oxide.

11. A PIN photodiode in accordance with claim 9 in which the undoped amorphous semiconductor is hydrogenated silicon and the undoped amorphous insulator is hydrogenated silicon nitride.

12. A PIN photodiode in accordance with claim 9 in which each of the outer zones comprises a multilayer including a plurality of successive periods, each period including a layer of undoped amorphous semiconductor contiguous to a layer of an undoped amorphous insulator, the forbidden energy gap of the insulator being wider than that of the semiconductor.

13. A PIN photodiode in accordance with claim 8 in which each of the two outer zones comprises a multilayer comprising alternate layers of undoped amorphous semiconductor and an undoped insulator.

14. A PIN photodiode in accordance with claim 8 in which each of the two outer zones and the inner zone comprises a multilayer comprising alternate layers of undoped amorphous semiconductor and an undoped insulator.

15. A PIN photodiode in accordance with claim 8 in which the inner zone also comprises a multilayer comprising alternate layers of undoped amorphous semiconductor and an undoped insulator.

* * * * *